(12) United States Patent
Sieg

(10) Patent No.: US 9,354,035 B2
(45) Date of Patent: May 31, 2016

(54) DEVICE AND METHOD FOR EVALUATING THE CAPACITANCE OF A SENSOR ELECTRODE OF A PROXIMITY SENSOR

(71) Applicant: Berthold Sieg, Bottrop (DE)

(72) Inventor: Berthold Sieg, Bottrop (DE)

(73) Assignee: Huf Huelsbeck & Fuerst GmbH & Co. KG, Velbert (DE)

( * ) Notice: Subject to any disclaimer, the term of this patent is extended or adjusted under 35 U.S.C. 154(b) by 0 days.

(21) Appl. No.: 14/651,135

(22) PCT Filed: Nov. 22, 2013

(86) PCT No.: PCT/EP2013/074449
§ 371 (c)(1),
(2) Date: Jun. 10, 2015

(87) PCT Pub. No.: WO2014/095224
PCT Pub. Date: Jun. 26, 2014

(65) Prior Publication Data
US 2015/0316680 A1    Nov. 5, 2015

(30) Foreign Application Priority Data

Dec. 18, 2012  (DE) .......................... 10 2012 112 479

(51) Int. Cl.

| | |
|---|---|
| G01R 27/26 | (2006.01) |
| G01B 7/14 | (2006.01) |
| G01V 13/00 | (2006.01) |
| G01V 3/08 | (2006.01) |
| E05F 15/73 | (2015.01) |
| H03K 17/955 | (2006.01) |
| H03K 17/96 | (2006.01) |

(52) U.S. Cl.
CPC . *G01B 7/14* (2013.01); *E05F 15/73* (2015.01); *G01V 3/088* (2013.01); *G01V 13/00* (2013.01); *H03K 17/955* (2013.01); *H03K 17/962* (2013.01); *E05Y 2900/50* (2013.01); *H03K 2217/9401* (2013.01); *H03K 2217/960705* (2013.01); *H03K 2217/960725* (2013.01)

(58) Field of Classification Search
CPC .............. G01B 7/04; G01B 7/14; G01B 7/23; G01B 7/34; G01B 7/287; H03K 17/955; H03K 17/962; G06F 3/41; G06F 3/44; G06F 3/46; G06F 3/416; G06F 3/488; G01R 27/2605; G01D 5/24
See application file for complete search history.

(56) References Cited

U.S. PATENT DOCUMENTS

| | | | | |
|---|---|---|---|---|
| 7,098,675 | B2 * | 8/2006 | Inaba ..................... | G01D 5/24 324/678 |
| 7,541,816 | B1 * | 6/2009 | Liao ....................... | G06F 3/044 324/548 |

(Continued)

FOREIGN PATENT DOCUMENTS

| | | |
|---|---|---|
| DE | 19617038 A1 | 11/1997 |
| DE | 19620059 A1 | 11/1997 |

(Continued)

OTHER PUBLICATIONS

International Search Report of International Application No. PCT/EP2013/074449 dated Feb. 12, 2014, 4 pages.

*Primary Examiner* — Minh N Tang
(74) *Attorney, Agent, or Firm* — Fay Sharpe LLP

(57) ABSTRACT

A method for evaluating a capacitance of a sensor electrode of a proximity sensor includes charging the electrode with a charge voltage. Simultaneously, a compensation capacitance is charged by coupling the compensation capacitance between a reference voltage and ground. The sensor electrode and the compensation capacitance are decoupled from voltage sources and a state of charge of the sensor electrode and of the compensation capacitance is maintained. The sensor electrode is coupled to the compensation capacitance and the charges are balanced; then decoupled from the compensation capacitance and the charge is maintained. The compensation capacitance is then coupled to an evaluation network. The charge of a hold capacitance in the evaluation network is reversed by a charge-reversal current which is dependent on the current flow of the compensation capacitance. The charge of the hold capacitance is evaluated after one or more such cycles.

12 Claims, 4 Drawing Sheets

(56) References Cited

U.S. PATENT DOCUMENTS

| | | | |
|---|---|---|---|
| 8,358,142 B2 * | 1/2013 | Maharyta | G01R 27/2605 324/658 |
| 2007/0046299 A1 | 3/2007 | Hargreaves et al. | |
| 2011/0210753 A1 | 9/2011 | Hourne | |

FOREIGN PATENT DOCUMENTS

| | | |
|---|---|---|
| EP | 1505734 A2 | 2/2005 |
| EP | 2442447 A2 | 4/2012 |
| WO | WO 2010/045662 A2 | 4/2010 |

* cited by examiner

DEVICE AND METHOD FOR EVALUATING THE CAPACITANCE OF A SENSOR ELECTRODE OF A PROXIMITY SENSOR

BACKGROUND

The invention relates to a method and associated circuit for detecting capacitances and capacitance changes at sensor electrodes.

Capacitive proximity switches are known in the prior art in the field of application for vehicles. By way of example, EP 1505734 discloses a capacitive proximity switch and an associated evaluation process. Capacitive proximity switches of this type have sensor electrodes and should respond when a certain capacitance or capacitance change is detected between the sensor electrode and a reference electrode. For this, numerous electrodes are frequently disposed in the region of a vehicle configured for detecting operation.

For detection, the sensor electrode is brought to a predefined potential, and forms a capacitance with a reference electrode, e.g. the vehicle ground or the ground of the surface located beneath the vehicle. This capacitance can change when a body moves in the sensitive region of the sensor assembly, e.g. the hand of a user or the foot of a user.

There are different fundamental explanations for this effect. On one hand, the dielectric surrounding the sensor electrode changes, and on the other hand, the body of the user forms a (conductive) electrode, such that its proximity corresponds to a coupling having another capacitance. In any case, the change in the environment of the sensor electrode caused by the operator body part leads to a change in the electrical field and to a charge transfer, and thus to the measurable capacitance. Independently of the explanation, the capacitance of the sensor electrode having a short-term variability, however, can be detected and indicates changes in the environment.

The detection of the capacitance itself can be achieved in a variety of ways. By way of example, a number of clocked discharge procedures or a discharge period can be used as the measurement value for the capacitance. Evaluation methods of this type are sufficiently known in the prior art. By way of example, a capacitive detection of a proximity to a vehicle door handle is known from DE 19617038A1.

One problem with the known sensor assemblies is that external factors lead to the capacitance measured at the sensor electrode being able to change without the approach of a user. The capacitance of a sensor electrode is highly dependent on the environment, e.g. the air humidity, a coating with rain, snow, ice or dirt in the region of the sensor electrode. In this context, a capacitive proximity sensor is known, for example, from DE 19620059A1, which only switches when the capacitance between the response electrode and the reference electrode changes at a rate that exceeds a lower threshold value.

These concepts do not change the fact that the evaluation circuit is normally configured to an operating point that corresponds to an expected capacitance or change in capacitance that is to be evaluated. If the capacitance is significantly changed by external factors, then the precision of the evaluation also sinks, because the configuration of the circuit no longer corresponds to the base value of the capacitance.

Moreover, it is always desirable to try to optimize the evaluation circuit with respect to the detection rate and reduction of the number of, or costs for, the components that are used, or the construction costs.

The object of the invention is to provide an improved evaluation circuit for detecting the capacitance at sensor electrodes.

BRIEF SUMMARY

This object is achieved by means of a method in accordance with claim 1 and a device according to claim 7.

In accordance with the invention, a method and a device are proposed, wherein a charge transfer from a sensor electrode that is to be measured is carried out with a capacitance that is to be determined.

As shall be described below in detail, a charge that is representative of the capacitance is accumulated on an auxiliary capacitor or support capacitor over the course of numerous measurement cycles.

The method is fundamentally based on the concept that numerous cycles of the recharging procedure are to be carried out for each detection of a capacitance, wherein in each cycle, the charging of a fixed support capacitor in the system is transferred. After a predefined number of cycles have been executed, the accumulated charge of the support capacitor is evaluated.

Each of the cycles is composed, in turn, of numerous phases. The capacitive sensor electrode is coupled thereby, during a first phase, in accordance with the invention, to a charge voltage, via a first switch device. This results in a charging of the sensor electrode. The charge at the sensor electrode, after charging, corresponds to the known equation for the relationship of the actual capacitance and the charge voltage (charge=capacitance*voltage).

The term "switch device" is to be understood, in the scope of this invention, as a controllable device for the targeted coupling, decoupling and recoupling of electrical devices in general. These are thus, in particular, electronic and mechanical switches, e.g., including single-pole and multi-pole toggle switches.

At the same time, a compensation capacitor is coupled into the system by means of a further, second switch device, between a reference voltage and a ground, independently of the charge of the sensor electrode. The reference capacitance is provided with a charge in accordance with the capacitance thereof and the value of the reference voltage.

These two procedures, thus the charging of the sensor electrode and the charging of the compensation capacitor, occur in the first phase at basically the same time, and independently of one another. The charge voltage and the reference voltage can furthermore be the same or different.

In a subsequent second phase of the cycle, the coupling between the charge voltage and the sensor electrode is interrupted; the associated first switch device is actuated for this. Furthermore, the coupling of the compensation capacitor between the reference voltage and ground is interrupted by means of another switch device.

The sensor electrode is then coupled with the compensation capacitor via a switch device (which can be formed by the first switch device, or can be a separate switch device), such that a charge equalization is obtained between the capacitors of the sensor electrode and the compensation capacitor. The charge flow that results is dependent, on one hand, on the scale of the capacitance of the sensor electrode and the compensation capacitor, and on the other hand, on the charge and reference voltages, and thus the pre-charging of the compensation capacitor and the sensor electrode in the preceding phase.

Different components can be used for the switch, preferably non-bridging switches, thus "break before make" switch devices.

Once this charge equalization stops, or after a defined waiting period, the third phase begins, specifically the phase in which the actual evaluation occurs.

At this point, by actuating the first switch device, the sensor electrode is again decoupled from the compensation capacitor (and, for example, again coupled to the charge voltage). Moreover, there is a charge at the compensation capacitor, which is established by the charge equalization between the sensor electrode and the compensation capacitor. The compensation capacitor is then coupled to a charge/accumulation network by engaging another switch, thus a third switch device, such that a discharge from the compensation capacitor of the charge occurs through the accumulation network, the resulting current flow is increased, and a recharging of a support capacitor occurs in the accumulation network. Accordingly, the charge state of the support capacitor changes by steps from one cycle to the next.

This can occur, by way of example, as shall be described in greater detail below, by conducting the current from the compensation capacitor through the base of a transistor, to which the support capacitor is coupled in an emitter-collector strand. The current flow flowing through the support capacitor, caused by the current flow through the compensation capacitor, charges or recharges the support capacitor, wherein the charged state of the support capacitor caused thereby remains substantially intact thereafter.

When this third phase is finished, one cycle is completed. In order to start the next cycle, a decoupling of the compensation capacitor from the accumulation network is subsequently carried out again by disengaging the third switch device, and the compensation capacitor is again coupled to the reference voltage for charging or discharging by switching the other switch device. The next cycle then begins in turn, starting with phase one, which is already described above.

After a number of cycles of this type have been executed, e.g. 5 to 20 cycles, there is a charge at the support capacitor that is representative of the capacity of the sensor electrode with respect to the environment. A representative value can then be sourced and stored as a measurement value for the sensor capacitance. Subsequently, the support capacitor is again brought to the original charge state, thus, e.g., coupled temporarily to the ground, and the next number of measurement cycles can begin.

The method according to the invention and the device according to the invention are distinguished with respect to known methods by numerous advantages. A substantial advantage is that with the actual charge accumulation at the support capacitor, the sensor electrode is already again decoupled from the evaluation procedure. The sensor electrode frequently brings disruptive factors into the system, because it is exposed, on one hand, and is strongly impacted by the lengths of conductors and by environmental factors. According to the invention, the charge transfer from the sensor electrode to the pre-charged compensation capacitor is carried out, then the coupling with the sensor electrode is interrupted, (galvanically separated) and first then, an evaluation of the charge present at the compensation capacitor is carried out. The method is thus more precise, and nevertheless less prone to disruptions.

Furthermore, it is possible to execute the method with an optimized measurement time; by way of example, it takes less than one millisecond to register eight measurement cycles.

Lastly, there is substantially less electromagnetic radiation than with known methods, because with this method there are only short impulses, alternating with longer breaks.

The structural design of the accumulation network can be determined by a person skilled in the art, within the scope of the invention. The important thing is that the charge transferred to the compensation capacitor when coupled to the compensation network results in an independent current, which recharges the support capacitor, e.g. a proportionally strengthened current. A possible and simple design for a compensation network is illustrated in the exemplary embodiment below. The support capacitor is coupled thereby to the charge voltage on one hand, and on the other hand, connected into the emitter-collector strand of a bipolar transistor, and to a ground via a resistor and the third switch device. If the transistor blocks the current flow, the charge at the support resistor is fixed and more or less frozen. If, however, the base of the transistor is coupled to the charged compensation capacitor by engaging a switch, and the current flow through the transistor is released, the support capacitor is recharged, correlating to the current flow through the base.

The important thing is that the switching procedures for the specified switch devices occur in a sequence, such that the phases of the evaluation are distinctly separate. Accordingly, the invention provides one switch for each sensor, which switch couples the sensor electrode with the compensation capacitor. Furthermore, a switch device is to be provided for each compensation capacitor, in order to couple said compensation capacitor with the accumulation network in a targeted manner.

Numerous sensors can share a compensation capacitor thereby, temporally offset to one another, as is likewise the case with a shared accumulation network.

In a further development of the invention, the compensation capacitor or its charging can be adjusted in the course of the evaluation process. The capacitance of the sensor electrode can change due to changing environmental conditions. The capacitance that is to be determined changes as a result of contaminants or moisture in the environment of the sensor electrode. Because only changes in capacitance are relevant for detecting uses, and not the absolute capacitance, an adjustment of the circuit to the currently present ground capacitance of the sensor electrode is desirable.

It is therefore possible in the scope of the invention to design the reference voltage of the compensation capacitor such that it is variable. A selectable charge is applied to the compensation capacitor, depending on the reference voltage (phase 1), which is subsequently available (in phase 2) for the charge equalization with the sensor electrode. If the reference voltage is altered, the charge applied to the compensation capacitor is also altered, and a different charge that is to be coupled to the accumulation network is depicted after the charge equalization. By this means, a type of offset correction of the charge to the sensor electrode is possible.

In practice, the charge at the support capacitor is evaluated (by taping into the voltage, for example) after completion of the predetermined number of cycles in order to adjust the reference voltage according to with the invention, and it is determined whether this value is located in a target region around an operating point. If it is determined that the capacitance of the sensor electrode deviates to one side of the desired operating point (without this signaling an actuation, thus with a greater time constant), this can be counteracted by the adjustment of the reference voltage to the compensation capacitor. This leads to an increased evaluation precision and sensitivity, because the evaluation network, thus the accumulation network, can be adjusted to a narrower operational range, to which the data that are to be evaluated can be restored.

In a further development of the invention, numerous compensation capacitors can be connected for compensation purposes, in order to likewise keep the charge quantities that are to be evaluated in an operational range. In order to connect further compensation capacitors, further capacitor strands can be connected, or variable capacitors can be used.

DETAILED DESCRIPTION

Figure 1:
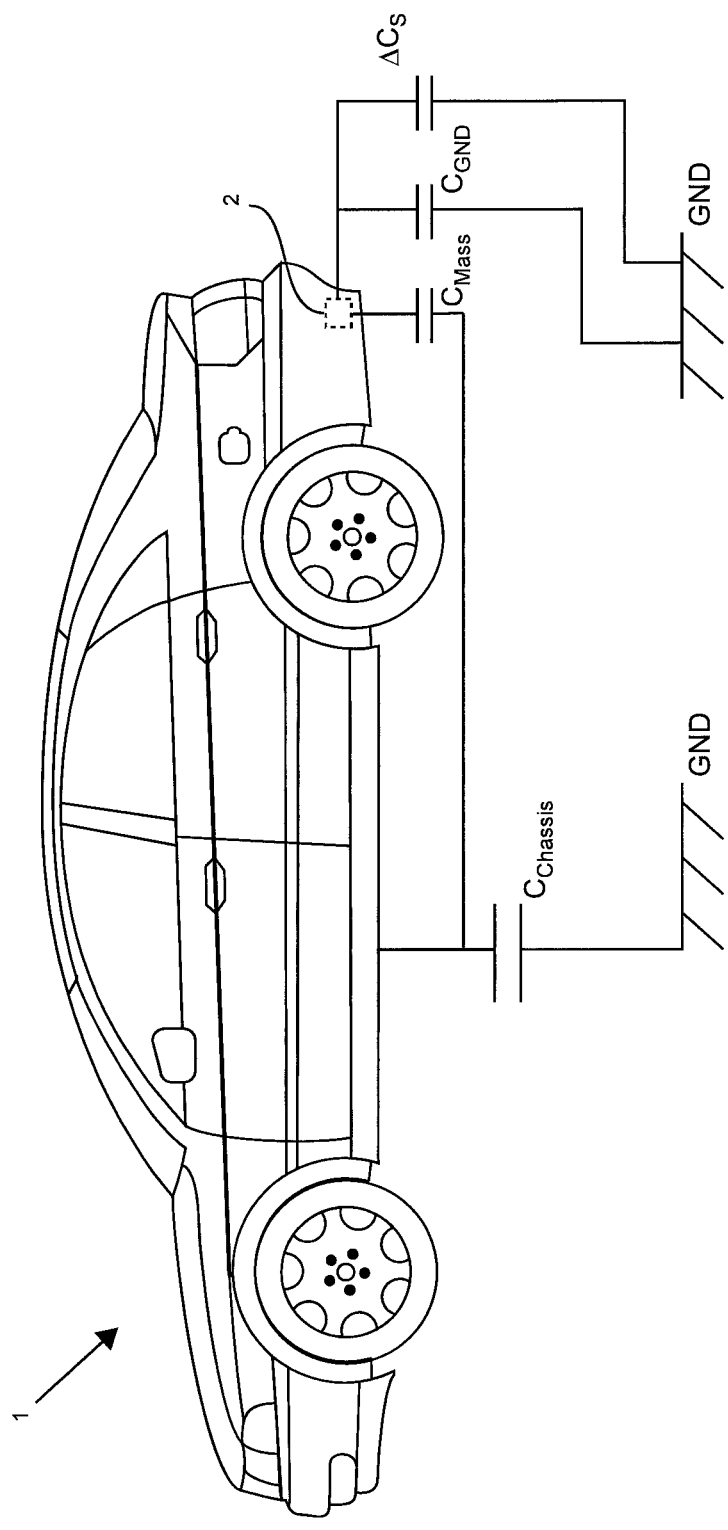
FIG. 1 is a schematic view of a vehicle including a capacitive sensor according to the present disclosure.

A vehicle 1 is depicted in FIG. 1, having a capacitive sensor 2 in the rear end thereof. The sensor 2 is designed as a sensor electrode, which is disposed in the rear bumper of the vehicle. When an actuation of a trunk lid is desired, a user can execute a movement gesture, in particular move the foot under the rear of the vehicle, in order to change the capacitance of the sensor electrode, and thus trigger the opening of the trunk.

The electrode extends in the width of the vehicle over the entire bumper, or in a specific subsection in which the user can execute the gesture.

The capacitances of the vehicle that are to be taken into account are shown schematically in the drawing. The chassis of the vehicle has a capacitance in relation to the actual ground potential, which is normally greater by orders of magnitude than the other capacitances. The capacitance $C_{Chassis}$ is normally many 100 pF, or even higher capacitances. For the following considerations, this capacitance of the vehicle in relation to the ground potential is accordingly negligible, because the vehicle chassis itself forms a vehicle ground in relation to the sensor electrode, which is labeled as $C_{Mass}$ in the schematic depiction.

Furthermore, the sensor electrode 2 has a capacitance in relation to the ground potential, amounting to a few pF, e.g. approx. 5 pF. Accordingly, in this schematic view, $C_{GND}$ is 5 pF.

Moreover, a variable capacitance $\Delta C_S$ acts in parallel to $C_{GND}$. This variable capacitance is dependent on environmental conditions or the movement of a body in the surrounding region of the sensor electrode 2. There are different fundamental explanations for this effect; on one hand, the dielectric surrounding the sensor electrode 2 changes, and on the other hand, a coupling of a further capacitor (the body of the operator) in parallel to $C_{GND}$ can be drawn from as an explanation. Independently of the explanation, however, the capacitance $\Delta C_S$ is that capacitance that is to be detected for the recognition of an actuation. The capacitance $\Delta C_S$, thus the change in capacitance through external factors or actuation, is significantly lower than the capacitance $C_{GND}$ thereby. Normally, the capacitance $\Delta C_S$ is less than one pF, e.g., less than 0.5 pF.

The capacitance $C_{GND}$ is changed by environmental factors, e.g. dried saltwater, a grease layer, or even lacquer applications on the bumper. When the capacitance $C_{GND}$ is increased, the actual detection capacitance $\Delta C_S$ is more difficult to detect. The field lines of the electric field, which are generated by the sensor electrode 2, are strongly influenced by disturbances of this type, in particular conductive layers, and no longer extend sufficiently into the detection range.

For this reason, it is important to detect small capacitance changes, even when the base capacitance that is present at all times is variable.

The invention is applied thereby, in that a displacement of the operating point for the circuit is possible depending on the detected measurement values.

Figure 2A:
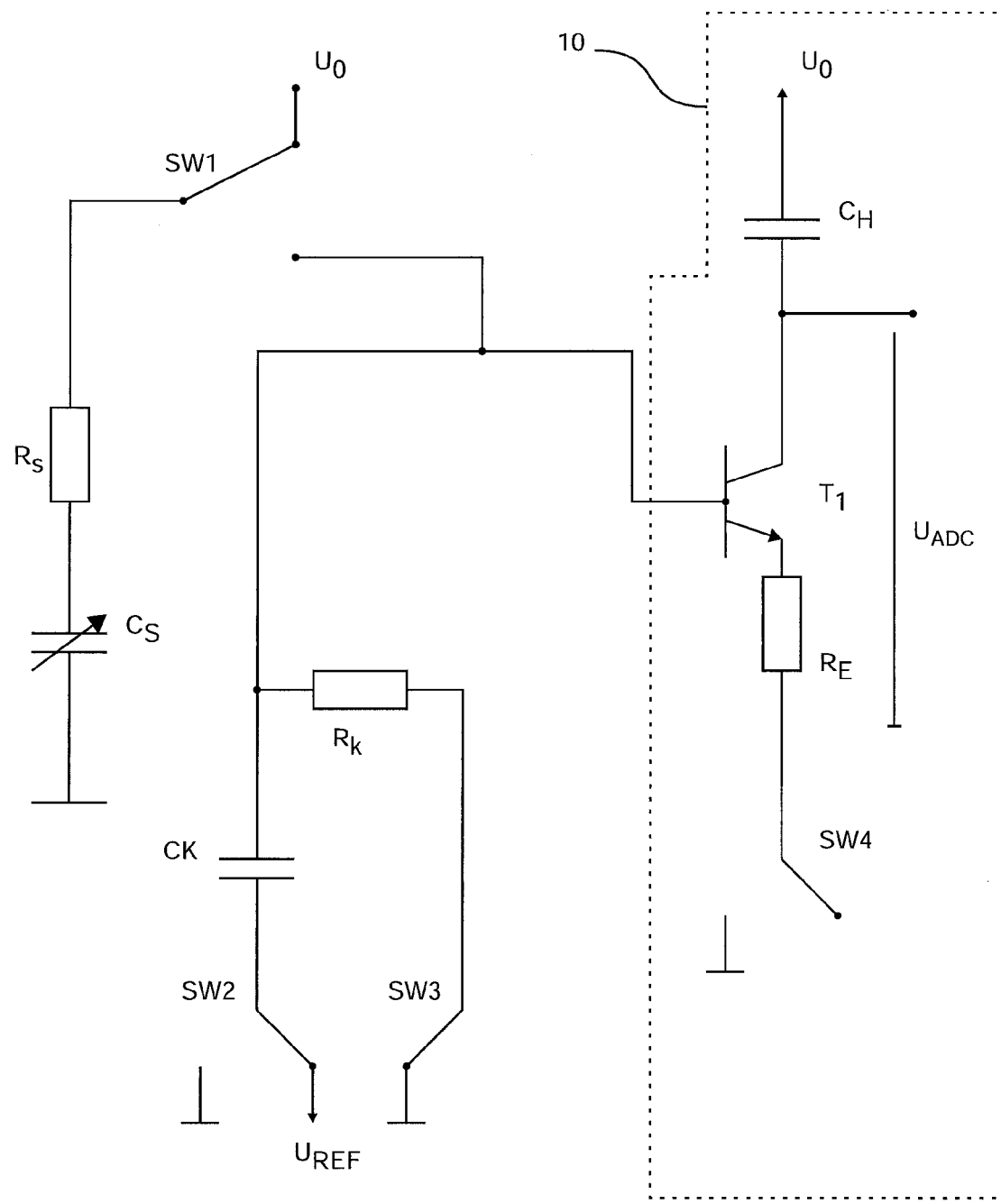
FIGS. 2A, 2B and 2C are circuit diagrams illustrating three phases of an evaluation procedure constituting one cycle according to the present disclosure.
Figure 2B:
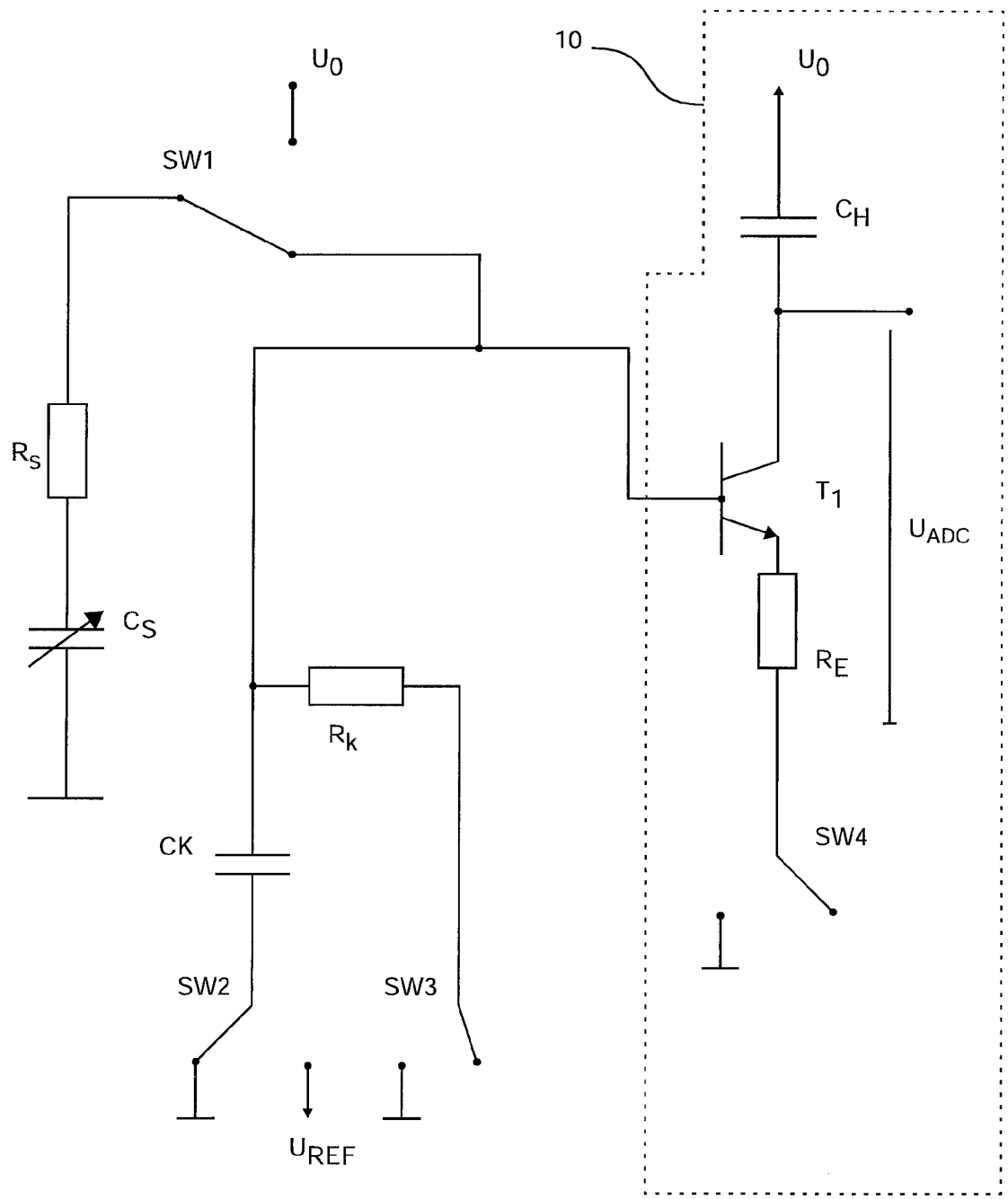
Figure 2C:
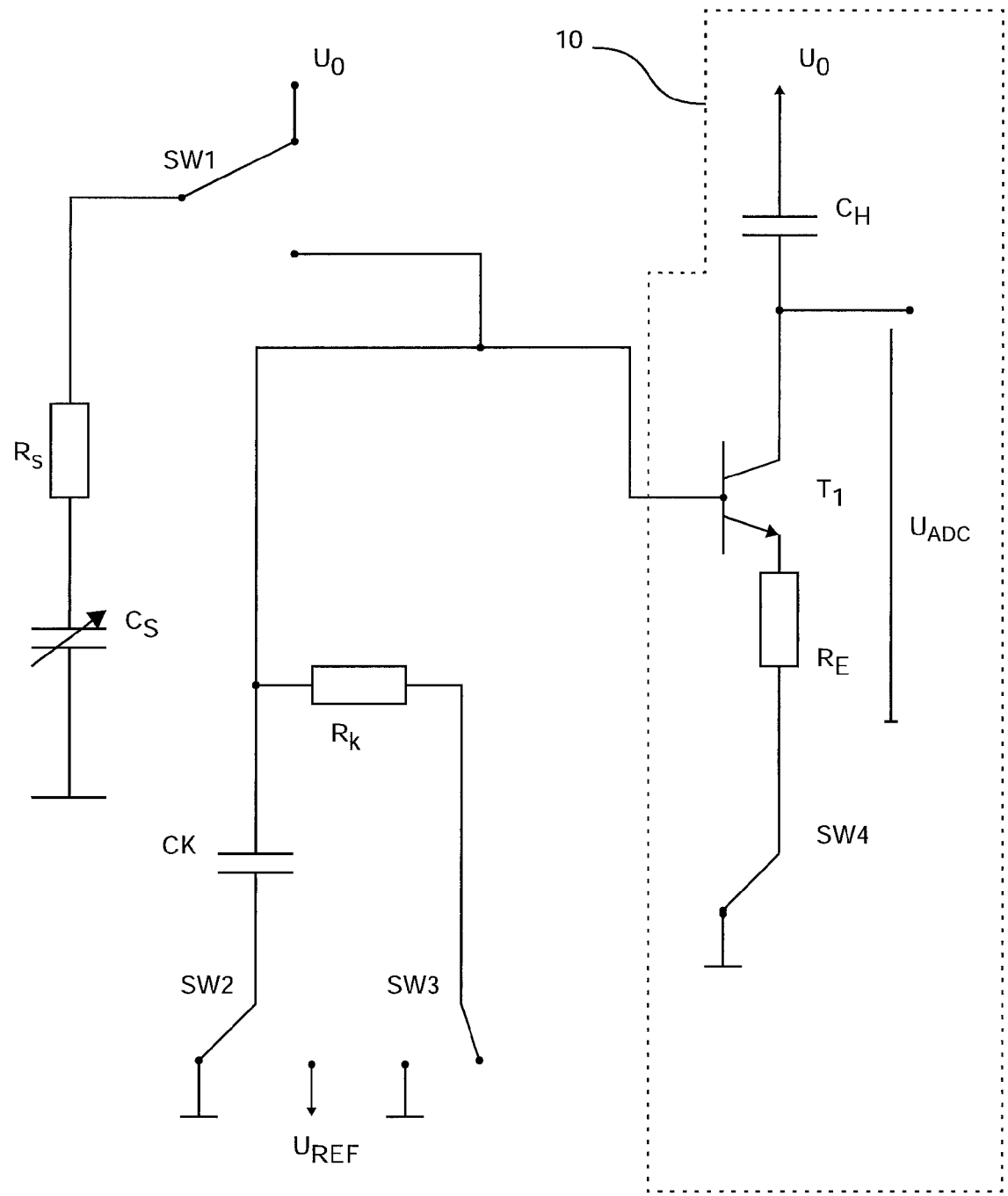

FIGS. 2a, 2b and 2c show the three phases of an evaluation procedure, thus one cycle of the numerous cycles that are to be executed.

FIG. 2a shows phase 1, in which a switch device SW1 couples the sensor electrode, depicted here by the variable capacitor $C_S$, to the charge voltage $U_0$ via a resistor $R_S$. In this phase, the capacitor $C_S$ is charged in accordance with its current capacitance and the charge voltage $U_0$. At the same time, in a region independent thereof, the capacitor $C_K$ is coupled via the switch devices SW2 and SW3 and a resistor $R_K$ to the reference voltage $U_{Ref}$ and the ground. The capacitor is charged here as well, in accordance with the applied reference voltage $U_{Ref}$ and the capacitor $C_K$. Although the capacitor $C_K$ is also coupled to the accumulation network 10 as a rule, no current flow can occur there, however, because the switch device SW4 is disengaged in the accumulation network 10. A current flow through the accumulation network 10 is therefore not possible.

The accumulation network 10 is composed of numerous components, wherein the support capacitor $C_H$ is coupled to the charge voltage $U_0$ on one hand, and is coupled to the transistor $T_1$ on the other hand. The transistor in this case is a bipolar transistor, which can be coupled to the ground via the resistor $R_E$ and the switch device SW4. In the state shown here, however, the switch device SW4 is disengaged, such that it is not possible to change the charge at the support capacitor $C_H$, in particular, it is not possible to discharge or charge the support capacitor.

It is likewise schematically depicted that the state of the support capacitor $C_H$ can be evaluated by tapping into the voltage of the voltage $U_{ADC}$ after numerous cycles for determining the capacitance $C_S$. After a predetermined time period, when it can be assumed that the capacitors $C_S$ and $C_K$ have been fully charged, the switch devices SW1, SW2 and SW3 are actuated. In this exemplary embodiment, the switch devices are "break before make" switches. It is essential that there are no undesired coupling in any of the phases. In particular, the switch device SW1, on one hand, and the switch devices SW2 and SW3, on the other hand, should be briefly disengaged at the same time, before the switches are re-engaged.

FIG. 2b shows the second phase of the evaluation cycle. After a switching, the capacitor $C_S$ is coupled to the capacitor $C_K$ via the switch device SW1. The switch device SW3 is disengaged, and a discharge of a charge to the ground can no longer occur via the resistor $R_K$. On the other hand, the capacitor $C_K$ is coupled to the ground via the switch device SW2, such that a charge equalization between $C_S$ and $C_K$ can occur.

The switch device SW4 remains disengaged, and a discharge of the charge remains impossible. In the state shown in FIG. 2b, a stable charge state of the capacitors $C_S$ and $C_K$ is thus obtained after a short time.

FIG. 2c shows the next phase of the evaluation process. The switch device SW1 is actuated again, and decouples the capacitor $C_S$ from the capacitor $C_K$ once again. The capacitance present at the capacitor $C_K$ remains present after the charge equalization, and a charge discharge is not possible at this point. The switch device SW1 again couples the capacitor $C_S$ to the charge voltage $U_0$, and once again, as in the initial state in FIG. 2a, the capacitor $C_S$ is charged in accordance with its current capacitance.

At this point, the switch device SW4 is engaged in order to couple the accumulation network to the ground, and the current flow is released through the accumulation network thereby. The capacitor $C_K$ is coupled to the base of the transistor $T_1$, and the charge can then flow from $C_K$ through the base of the transistor $T_1$. A strengthened current flow then flows through the base-emitter strand of the transistor T1, in order to recharge the capacitor $C_H$. This only occurs as long as a current flow is present, starting from the capacitor $C_K$, through the accumulation network, to the ground. It should be noted that $C_K$ is still coupled to a ground. The capacitor $C_H$ is thus recharged until this charge corresponds to the charge quantity at the capacitor $C_K$ after the charge equalization. After a short time, the switch SW4 can again be disengaged, thus preventing a current flow through the base and the transistor, and the capacitor $C_H$ remains at its charge state.

If these phases of the evaluation, from FIGS. 2a, 2b, and 2c, are repeated numerous times, a charge is accumulated at the capacitor $C_H$ that is representative of the charge at the capacitor $C_S$, thus the sensor electrode.

It is furthermore apparent that the sensor electrode $C_S$, which frequently leads to disruptions in the evaluation electronics, during the actual evaluation procedure, thus the coupling to the accumulation network 10, is completely decoupled from the evaluation.

Moreover, it can be seen that in this simple construction, a change in the voltage $U_{Ref}$ is accompanied by a change in the charge at the compensation capacitor. By changing this voltage, it is possible to return to an operational range for which the accumulation network 10 is configured.

The number of components used for this device is low, and the reliability and sensitivity of the network is particularly advantageous.

The invention claimed is:

1. A method for evaluating the capacitance of a sensor electrode of a proximity sensor, having the steps:
    charging the sensor electrode by coupling the sensor electrode to a charge voltage by means of a sensor electrode switch device,
    charging a compensation capacitor by coupling the compensation capacitor between a reference voltage and the ground by means of a compensation capacitor switch device,
    decoupling the sensor electrode from the charge voltage by means of the sensor electrode switch device and decoupling the compensation capacitor from the reference voltage by means of the compensation capacitor switch device, wherein a charge state of the sensor electrode and compensation capacitor is maintained,
    coupling the sensor electrode to the compensation capacitor by means of the sensor electrode switch device, in order to cause a charge equalization between the capacitor formed by the sensor electrode and the compensation capacitor,
    decoupling the sensor electrode from the compensation capacitor by means of the sensor electrode switch device, wherein the charge of the compensation capacitor resulting from the charge equalization is maintained,
    coupling the compensation capacitor to an evaluation network by means of an evaluation network switch device, in order to cause a current flow from the compensation capacitor through the evaluation network,
    recharging a support capacitor in an evaluation network with a recharge current dependent on the current flow of the compensation capacitor.

2. The method according to claim 1, wherein the steps are repeated over the course of numerous cycles in order to cause a repeated recharging of the support capacitor and to cause a charge accumulation at the support capacitor, wherein, prior to the repetition of the steps:
    the compensation capacitor is decoupled from the evaluation network,
    the sensor electrode is re-coupled to the charge voltage, and the compensation capacitor is again coupled into the system, between the reference voltage and the ground.

3. The method according to claim 1, wherein the charge state of the support capacitor is evaluated in order to obtain a measurement value for the capacitance of the sensor electrode.

4. The method according to claim 3, wherein, depending on the measurement value, the reference voltage level is altered.

5. The method according to claim 3, wherein, depending on the measurement value, the capacitance of the compensation capacitor is altered.

6. The method according to claim 1, wherein the current flow from the compensation capacitor ($C_K$) to the recharge current of the support capacitor ($C_H$) is increased.

7. A sensor device for detecting proximities, having a capacitive sensor electrode, wherein a sensor electrode switch device is provided, and the sensor electrode is coupled to the sensor electrode switch device, wherein a charge voltage source is coupled to the sensor electrode switch device, wherein a compensation capacitor is formed, which is coupled to at least one compensation capacitor switch device, wherein a reference voltage source is coupled to the compensation capacitor switch device, wherein the compensation capacitor switch device can be activated to either couple the compensation capacitor to the reference voltage source and ground in order to charge the compensation capacitor, or to decouple the compensation capacitor from the reference voltage source, in order to maintain the charge, wherein an evaluation network is formed, which can be coupled to the compensation capacitor via an evaluation network switch device, wherein the evaluation network has at least one support capacitor, wherein the sensor electrode switch device can be activated in order to couple the sensor electrode to at least the charge voltage source and, alternatively, to the compensation capacitor.

8. The sensor device according to claim 7, wherein the evaluation network is designed to strengthen a current flow from the compensation capacitor through the evaluation network, and to recharge the support capacitor with the strengthened current flow.

9. The sensor device according to claim 7, wherein the reference voltage source is designed as a voltage source having a variable direct current voltage.

10. The sensor device according to claim 7, wherein the compensation capacitor is formed by a capacitor network, wherein different capacitors can be connected thereto in order to form the compensation capacitor.

11. The sensor device according to claim 7, wherein the support capacitor is coupled to a voltage access in order to detect the charge state of the support capacitor.

12. The sensor device according to claim 7, wherein the coupling of the evaluation network to the compensation capacitor is formed via a transistor, wherein the compensation capacitor can be coupled to the base of the transistor, and wherein the emitter-collector strand of the transistor is coupled to the support capacitor between the transistor and a direct current voltage source, and the ground can be coupled to the transistor at the other side, such that a current flow from the compensation capacitor through the transistor base results in a strengthened recharge current through the base-emitter strand of the transistor, and thus through the support capacitor.

* * * * *